US009054697B2

United States Patent
Choi et al.

(10) Patent No.: US 9,054,697 B2
(45) Date of Patent: Jun. 9, 2015

(54) MAJORITY DECISION CIRCUIT

(71) Applicant: SK hynix Inc., Gyeonggi-do (KR)

(72) Inventors: Hae-Rang Choi, Gyeonggi-do (KR);
Yong-Ju Kim, Gyeonggi-do (KR);
Oh-Kyong Kwon, Gyeonggi-do (KR);
Kang-Sub Kwak, Gyeonggi-do (KR);
Jun-Yong Song, Gyeonggi-do (KR);
Hyeon-Cheon Seol, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 140 days.

(21) Appl. No.: 13/890,802

(22) Filed: May 9, 2013

(65) Prior Publication Data

US 2013/0249593 A1     Sep. 26, 2013

Related U.S. Application Data

(62) Division of application No. 13/334,355, filed on Dec. 22, 2011, now Pat. No. 8,476,924.

(30) Foreign Application Priority Data

Nov. 9, 2011  (KR) .................. 10-2011-0116205

(51) Int. Cl.
*H03K 19/23*     (2006.01)
*H03K 19/003*    (2006.01)
*H03K 19/08*     (2006.01)

(52) U.S. Cl.
CPC ............ *H03K 19/0813* (2013.01); *H03K 19/23* (2013.01)

(58) Field of Classification Search
USPC .................... 326/36, 35, 115, 119, 11, 13
See application file for complete search history.

(56) References Cited

U.S. PATENT DOCUMENTS 7,406,608 B2 *   7/2008   Joshi ............................. 713/300
2006/0248326 A1 * 11/2006  Joshi ................................. 713/1

* cited by examiner

*Primary Examiner* — Daniel D Chang
(74) *Attorney, Agent, or Firm* — IP&T Group LLP

(57) ABSTRACT

A majority decision circuit includes: a majority decision unit configured to compare first data with second data to decide whether one of the first data and the second data has more bits with a first logical value; and an offset application unit configured to control the majority decision unit so that the majority decision unit decides, in a case when the number of bits with the first logical value among the first data is equal to the number of bits with the first logical value among the second data, that the first data have more bits with the first logical value if offset is a first setting value in a first phase and decides that the second data have more bits with the first logical value if the offset is a second setting value in a second phase.

5 Claims, 4 Drawing Sheets

MAJORITY DECISION CIRCUIT

CROSS-REFERENCE TO RELATED APPLICATIONS

This application is a division of U.S. patent application Ser. No. 13/334,355 filed on Dec. 22, 2011, which claims priority of Korean Patent Application No. 10-2011-0116205 filed on Nov. 9, 2011. The disclosure of each of the foregoing applications is incorporated herein by reference in its entirety

BACKGROUND

1. Field

Exemplary embodiments of the present invention relate to a majority decision circuit.

2. Description of the Related Art

A majority decision circuit compares two input data (digital signals of 1 bit or more data) to decide whether any one of the two input data has more bits having a specific logical value (for example, '1' or '0'). As the majority decision circuit, there may be an analog majority decision circuit or a digital majority decision circuit.

FIG. 1 illustrates a configuration of a conventional analog majority decision circuit.

As illustrated in FIG. 1, the analog majority decision circuit includes a first current source 110 that receives first data D1<0:3>, a second current source 120 that receives second data D2<0:3>, and first and second nodes N1 and N2 that each have a voltage at the node determined as a comparison result of the number of bits having the logical value '1' (or '0') among the respective first data D1<0:3> and the second data D2<0:3>. In addition, the analog majority decision circuit includes a common transistor T_COM connected to a common node COM that is turned on or turned off by an enable signal EN.

The first current source 110 determines an amount of current that flows in the first node N1 in response to the first data D1<0:3>, wherein the voltage of the first node N1 is determined by a voltage drop occurring in a first resistor R1 due to the current. Further, the second current source 120 determines an amount of current that flows in the second node N2 in response to the second data D2<0:3>, wherein the voltage of the second node N2 is determined by a voltage drop generated in a second resistor R2 due to the current. According to an example, the first current source 110 includes a plurality of first transistors T1_0 to T1_3 that are each turned on/off depending on the logical value of the respective bit input thereto among the first data D1<0:3> and the second current source 120 includes a plurality of second transistors T2_0 to T2_3 that are each turned on/off depending on the logical value of the respective bit input thereto among the second data D2<0:3>.

The analog majority decision circuit is activated or inactivated by the enable signal EN. If the common transistor T_COM is turned on by the activation ('high') of the enable signal EN, current flows in the first node N1 and the second node N2 through the common node COM by the first current source 110 and the second current source 120, respectively, and therefore, the analog majority decision circuit performs a majority decision operation on the input first data D1<0:3> and second data D2<0:3>. If the common transistor T_COM is turned off by the inactivation of the enable signal EN ('low'), current does not flow through the common node COM and thus, the voltage drop due to the first and second resistors R1 and R2 does not occur. Therefore, the analog majority decision circuit does not perform the majority decision operation. Here, the majority decision operation means an operation that decides whether any one of the input data D1<0:3> and D2<0:3> has more bits having the specific logical value.

The operation of the analog majority decision circuit illustrated in FIG. 1 is as follows.

If it is determined that the number of bits having the logical value '1' among the first data D1<0:3> is more than the number of bits having the logical value '1' among the second data D2<0:3>, the number of transistors that is turned on among the plurality of first transistors T1_0 to T1_3 is more than the number of transistors that is turned on among the plurality of second transistors T2_0 to T2_3, such that the current flowing in the first node N1 is larger than the current flowing in the second node N2. Therefore, the larger voltage drop occurs in the first resistor R1 than in the second resistor R2, such that the voltage of the first node N1 is lower than that of the second node N2. In other words, if the number of bits having the logical value '1' among the first data D1<0:3> is more than the number of bits having the logical value '1' among the second data D2<0:3>, the voltage of the first node N1 is in a 'low' level and the voltage of the second node N2 is in a 'high' level. On the other hand, if the number of bits having the logical value '1' among the second data D2<0:3> is more than the number of bits having the logical value '1' among the first data D1<0:3>, the voltage of the first node N1 is in the 'high' level and the voltage of the second node N2 is in the 'low' level.

Here, when the enable signal EN is a clock signal, the analog majority decision circuit is activated in a 'high' level period of the clock signal (performing the majority decision operation) and is inactivated in a 'low' level period of the clock signal (both of the first node N1 and the second node N2 are in the 'high' level').

The analog majority decision circuit can reduce the number of transistors, circuit area, and power consumption while implementing a high-speed operation. However, the analog majority decision circuit does not output a signal indicating a situation where the number of bits having the logical value '1' among one input data is equal to the number of bits having the logical value '1' among another input data.

On the other hand, the digital majority decision circuit uses two adders that add and output the number of bits having the logical value '1' among the first data D1<0:3> and add and output the number of bits having the logical value '1' among the second data D2<0:3>. Next, the digital majority decision circuit uses a comparator to compare results output from the adders to decide the majority. When the results output from the adders are the same, the comparator activates a signal representing that the number of bits having the logical value '1' among one input data is equal to the number of bits having the logical value '1' among the other input data. However, the implementation of the adder and the comparator is complicated and a larger number of transistors are used, such that the area of the circuit may increase.

SUMMARY

An embodiment of the present invention is directed to a majority decision circuit capable of outputting comparison results of the number of bits representing a specific logical value among each bit of two input data while simplifying a configuration and reducing an area and outputting a signal representing when the number of bits representing the specific logical value among each bit of one input data is equal to number of bits representing the specific logical value among each bit of the other input data.

In accordance with an embodiment of the present invention, a majority decision circuit includes: a majority decision unit configured to compare first data with second data to decide whether one of the first data and the second data has more bits with a first logical value; and an offset application unit configured to control the majority decision unit so that the majority decision unit decides, in a case when the number of bits with the first logical value among the first data is equal to the number of bits with the first logical value among the second data, that the first data have more bits with the first logical value if offset is a first setting value in a first phase and decides that the second data have more bits with the first logical value if the offset is a second setting value in a second phase.

In accordance with another embodiment of the present invention, a majority decision circuit includes: a first resistive element connected to a first node; a second resistive element connected to a second node; a first current source configured to supply a current determined by the first data to the first node; a second current source configured to supply a current determined by the second data to the second node; a first additional current source configured to supply additional current to the first node when the offset is set to be a first setting value in a first phase; and a second additional current source configured to supply additional current to the second node when the offset is set to be a second setting value in a second phase.

In accordance with still another embodiment of the present invention, a majority decision circuit includes: a first majority decision unit configured to compare first data with second data to output decision results on whether one of the first data and the second data has more bits with a first logical value and output a logical value when the number of bits with the first logical value among the first data is equal to the number of bits with the first logical value among the second data; a second majority decision unit configured to compare first data with second data to output decision results on whether one of the first data and the second data has more bits with a first logical value and output a logical value that is an inverse of the logical value output from the first majority decision unit when the number of bits with the first logical value among the first data is equal to the number of bits with the first logical value among the second data; and an equal signal generator configured to activate an equal signal representing that the number of bits with the first logical value among the first data is equal to the number of bits with the first logical value among the second data when the logical value output from the first majority decision unit is different from the logical value output from the second majority decision unit.

DETAILED DESCRIPTION

Figure 1:
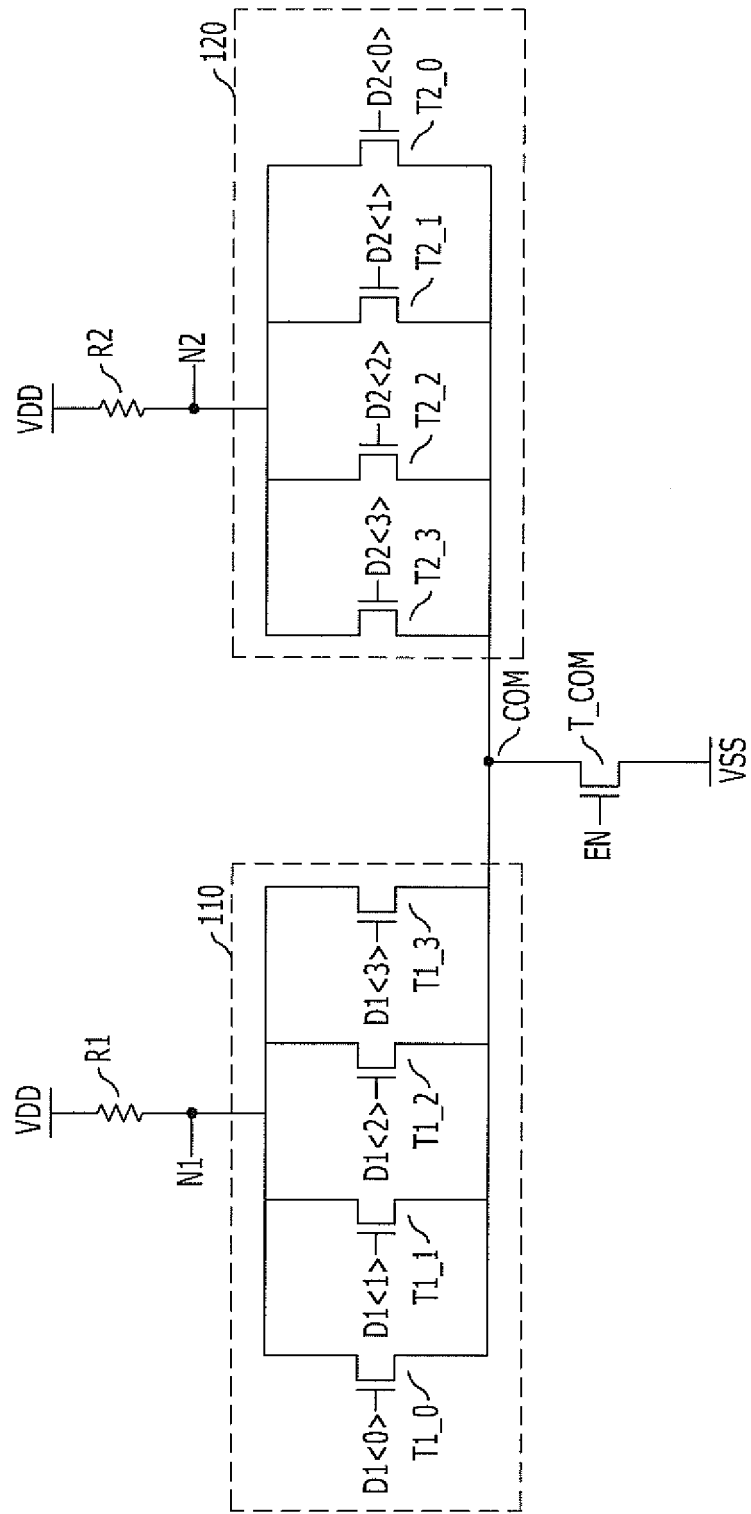
FIG. 1 is a configuration diagram of a conventional analog majority decision circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, the 'low' level means the logical value '0' and the 'high' level means the logical value '1'. An active level and an inactive level of a signal may be changed to 'high' or 'low' voltage levels for each signal or may be changed depending on different design needs. Further, whether the voltage of a specific node is at the 'high' level or the 'low' level means that a logical value represented by the voltage of the specific node is at the 'high' level or the 'low' level.

Figure 2:
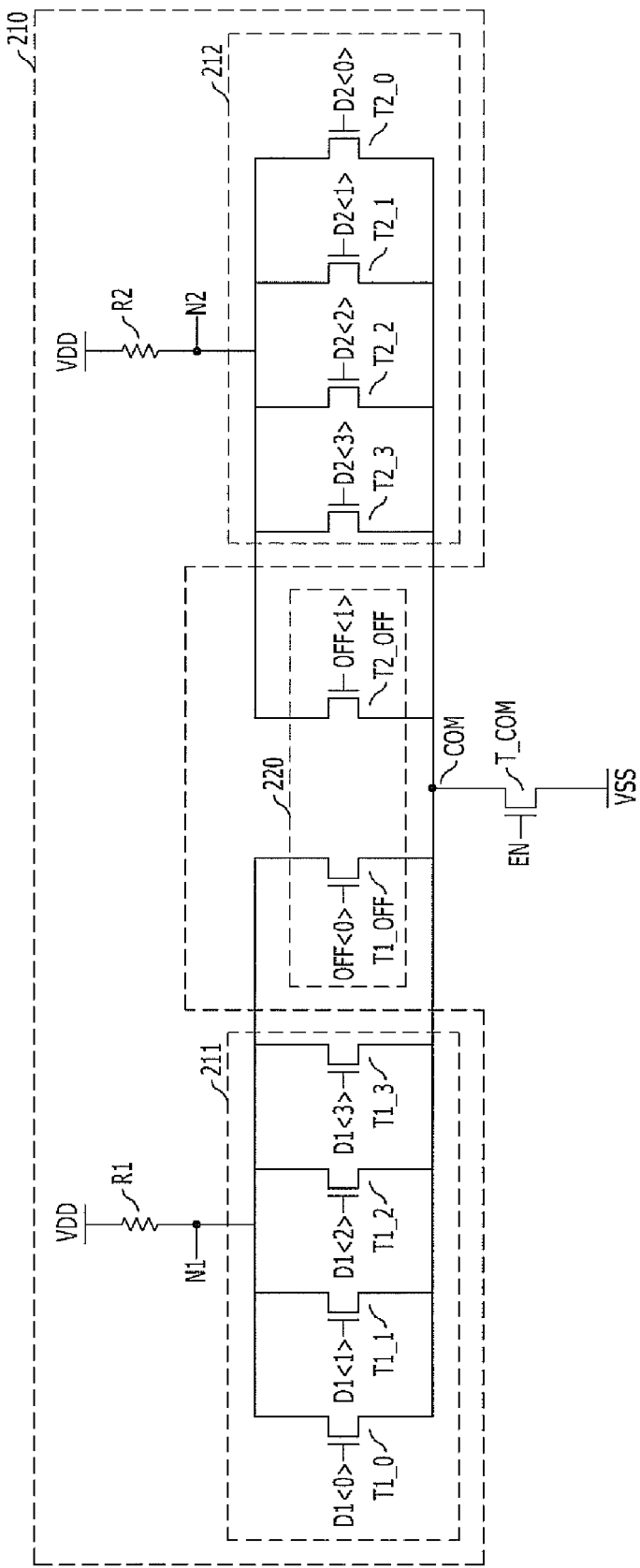
FIG. 2 is a configuration diagram of the majority decision circuit in accordance with the embodiment of the present invention.

FIG. 2 is a configuration diagram of a majority decision circuit in accordance with the embodiment of the present invention.

As illustrated in FIG. 2, the majority decision circuit includes a majority decision unit 210 that decides data having more bits with a first logical value by comparing first data D1<0:3> with second data D2<0:3>. When the number of bits having the first logical value among the first data D1<0:3> is equal to the number of bits having the first logical value among the second data D2<0:3>, an offset application unit 220 enables the majority decision unit 210 to decide that the first data D1<0:3> have more bits having the first logical value if offset OFF<0:1> is a first setting value and decide that the second data D2<0:3> have more bits having the first logical value if the offset OFF<0:1> is a second setting value. Here, the offset OFF<0:1> is set to be the first setting value in a first phase and is set to be a second setting value in a second phase.

Here, the first logical value may be '1' (or 'high') or '0' (or 'low'). Hereinafter, the case in which the first logical value is '1' will be described.

The majority decision circuit will be described with reference to FIG. 2. The cases in which the number of bits having the logical value '1' among the first data D1<0:3> input to the majority decision circuit is different from or equal to the number of bits having the logical value '1' among the second data D2<0:3> will be described separately.

(1) Case in which the number of bits having the logical value '1' among the first data D1<0:3> is different from the number of bits having the logical value '1' among the second data D2<0:3>

When the number of bits having the logical value '1' among the first data D1<0:3> is different from the number of bits having the logical value '1' among the second data D2<0:3>, the majority decision results of the majority decision unit 210 in the first phase are the same as the majority decision results of the majority decision unit 210 in the second phase.

The majority decision unit 210 receives the first data D1<0:3> and the second data D2<0:3> to decide whether any data of the first data D1<0:3> and the second data D2<0:2> has more bits that are '1'. The voltage of the first node N1 and the second node N2 is determined depending on the majority decision results of the majority decision unit 210 as follows. If the number of bits having the logical value '1' among the first data D1<0:3> is more than the number of bits having the logical value '1' among the second data D2<0:3>, the voltage of the first node N1 is at the 'low' level and the voltage of the second node N2 is at the 'high' level. On the other hand, if the number of bits having the logical value '1' among the second data D2<0:3> is more than the number of bits having the logical value '1' among the first data D1<0:3>, the voltage of the first node N1 is at the 'high' level and the voltage of the second node N2 is at the 'low' level. If the number of bits having the logical value '1' among the first data D1<0:3> is different from the number of bits having the logical value '1' among the second data D2<0:3>, the offset application unit 220 does not affect the decision (that is, the voltage of the first node N1 and the voltage of the second node N2) of the majority decision unit 210 independent of a value of the offset OFF<0:1> for the reason described below.

According to an example, the majority decision unit 210 includes a first resistive element R1 that is connected to the first node N1 to lead to a voltage drop, a second resistive element R2 that is connected to the second node N2 to lead to a voltage drop, a first current source 211 that flows a positive current determined by the first data D1<0:3> at the first node N1, and a second current source 212 that flows a positive current determined by the second data D2<0:3> at the second node N2. Here, a resistance value of the first resistive element R1 may equal a resistance value of the second resistive element R2.

The first current source 211 may include more than one first transistor T1_0 to T1_3 (assumed to be 4 in FIG. 2) that is turned on or turned off in response to bits D1<0> to D1<3> of the first data and the second current source 212 may include more than one second transistor T2_0 to T2_3 that is turned on or turned off in response to bits D2<0> to D2<3> of the second data. Each first transistor T1_0 to T1_3 is turned on if a respective one of bits D1<0> to D1<3> of the first data is '1' and is turned off if the respective one of bits D1<0> to D1<3> of the first data is '0'. Each second transistor T2_0 to T2_3 is turned on if a respective one of bits D2<0> to D2<3> of the second data is '1' and is turned off if the respective one of bits D2<0> to D2<3> of the second data is '0'. Here, when more than one transistor is turned on, the amount of current flowing from each transistor T1_0 to T1_3 and T2_0 to T2_3 may be the same.

Therefore, if it is determined that the number of bits having the logical value '1' among the first data D1<0:3> is more than the number of bits having the logical value '1' among the second data D2<0:3>, the number of first transistors T1_0 to T1_3 that is turned on is more than the number of second transistors T2_0 to T2_3 that is turned on, such that the amount of current flowing at the first node N1 is larger than the amount of current flowing at the second node N2. Therefore, the voltage drop due to the first resistive element R1 is larger than the voltage drop due to the second resistive element R2 and the voltage of the first node N1 is at the 'low' level and the voltage of the second node N2 is at the 'high' level. Further, if the number of bits having the logical value '1' among the second data D2<0:3> is more than the number of bits having the logical value '1' among the first data D1<0:3> on the other hand, the voltage of the first node N1 is at the 'high' level and the voltage of the second node N2 is at the 'low' level.

The offset application unit 220 includes a first offset transistor T1_OFF (turned on/off in response to OFF<0>) and the second offset transistor T2_OFF (turned on/off in response to (OFF<1>) that are turned on or turned off in response to offset signal OFF<0:1> that is the first setting value (OFF<0> and OFF<1> are (1, 0), respectively) or the second setting value (OFF<0> and OFF<1> are (0, 1), respectively).

Here, the amount of current flowing when the first offset transistor T1_OFF is turned on is smaller than the amount of current flowing when a single first transistor T1_0 to T1_3 or a single second transistor T2_0 to T2_3 is turned on. In addition, the amount of current flowing when a second offset transistor T2_OFF is turned on is also smaller than the amount of current flowing when a single first transistor T1_0 to T1_3 or a single second transistor T2_0 to T2_3 is turned on. That is, the current flowing from any of the first offset transistor T1_OFF and the second offset transistor T2_OFF is smaller than the current flowing from each of the transistors T1_0 to T1_3 and T2_0 to T2_3) (small in magnitude).

Therefore, the voltage drop occurring due to the first offset transistor T1_OFF or the second offset transistor T2_OFF is smaller than that occurring due to the single first transistor T1_0 to T1_3 or the single second transistor T2_0 to T2_3. As a result, when the number of bits having the logical value '1' among the first data D1<0:3> is different from the number of bits having the logical value '1' among the second data D2<0: 3>, the logical value represented by the voltage of the first node N1 and the second node N2 is not changed even when the value of the offset OFF<0:1> is changed (that is, the value of the offset OFF<0:1> does not affect the decision of the majority decision unit 210).

Therefore, when the number of bits having the logical value '1' among the first data D1<0:3> is different from the number of bits having the logical value '1' among the second data D2<0:3>, the logical value represented by the voltage of the first node N1 and the second node N2 is not changed regardless of whether the offset OFF<0:1> is the first setting value in the first phase and the offset OFF<0:1> is the second setting value in the second phase. For example, if the number of bits having the logical value '1' among the first data D1<0: 3> is more than the number of bits having the logical value '1' among the second data D2<0:3>, the voltage of the first node N1 is at the 'low' level and the voltage of the second node N2 is at the 'high' level, in the first phase and the second phase.

(2) Case in which the number of bits having the logical value '1' among the first data D1<0:3> is equal to the number of bits having the logical value '1' among the second data D2<0:3>.

When the number of bits having the logical value '1' among the first data D1<0:3> is equal to the number of bits having the logical value '1' among the second data D2<0:3>, the majority decision results of the majority decision unit 210 in the first phase are different from the majority decision results of the majority decision unit 210 in the second phase.

The amount of current flowing from the first current source 211 to the first node N1 is equal to the amount of current flowing from the second current source 212 to the second node N2 and thus, the voltage drop occurring due to the first current source 211 is equal to the voltage drop occurring due to the second current source 212. Therefore, in this case, the voltage of the first node N1 and the second node N2 is determined by the value of the offset OFF<0:1>.

If the offset OFF<0:1> is the first setting value in the first phase, that is, 1 and 0, respectively, the number of bits having the logical value '1' among the first data D1<0:3> is equal to the number of bits having the logical value '1' among the second data D2<0:3>, the voltage of the first node N1 is at the 'low' level and the voltage of the second node N2 is at the 'high' level. On the other hand, if the offset OFF<0:1> is the second setting value in the second phase, that is, 0 and 1, respectively, the number of bits having the logical value '1' among the first data D1<0:3> is equal to the number of bits having the logical value '1' among the second data D2<0:3>, the voltage of the first node N1 is at the 'high' level and the voltage of the second node N2 is at the 'low' level.

Therefore, when the number of bits having the logical value '1' among the first data D1<0:3> is equal to the number of bits having the logical value '1' among the second data D2<0:3>, the logical value represented by the voltage of the first node N1 and the second node N2 in the first phase and the logical value represented by the voltage of the first node N1 and the second node N2 in the second phase are each changed when the offset OFF<0:1> is the second setting value in the first phase and the offset OFF<0:1> is the second setting value in the second phase. In the first phase, the voltage of the first node N1 is at the 'low' level and the voltage of the second node N2 is at the 'high' level (it is decided that the first data D1<0:3> have the number of bits having the logical value '1' more than that of the second data D2<0:3>, in the first phase) and in the second phase, the voltage of the first node N1 is at the 'high' level and the voltage of the second node is at the 'low' level (it is decided that the second data D2<0:3> have the number of bits having the logical value '1' more than that of the first data D1<0:3>, in the second phase).

The majority decision circuit in accordance with the embodiment of the present invention, which is an analog majority decision circuit, may easily decide whether the number of bits having the logical value '1' among the data to be compared is the same.

Hereinafter, the majority decision circuit in accordance with the embodiment of the present invention will be described with reference to FIG. 2.

As illustrated in FIG. 2, the majority decision circuit includes the first resistive element R1 that is connected to the first node N1 to cause the voltage drop, a second resistive element R2 that is connected to the second node N2 to cause the voltage drop, a first current source 211 that flows the positive current determined by the first data D1<0:3> at the first node N1, a second current source 212 that flows the positive current determined by the second data D2<0:3> at the second node N2, a first additional current source T1_OFF that flows additional current at the first node N1 if the offset OFF<0:1> is the first setting value (OFF<0> and OFF<1> are (1, 0)), and a second additional current source T2_OFF that flows the additional current at the second node N2 if the offset OFF<0:1> is the second setting value (OFF<0> and OFF<1> are (0, 1)), wherein the offset (OFF<0:1>) is set to be the first setting value in the first phase and is set to be the second setting value in the second phase. In this configuration, the first additional current source T1_OFF corresponds to the first offset transistor T1_OFF of the aforementioned offset application unit 220 and the second additional current source T2_OFF corresponds to the second offset transistor T2_OFF of the aforementioned offset application unit 220.

The majority decision circuit of FIG. 2 further includes a common node COM that is connected to all of the first current source 211, the second current source 212, the first additional current source T1_OFF (first offset transistor), and the second additional current source T2_OFF (second offset transistor) and a common current source T_COM that is connected to the common node COM and flows current at the common node COM.

The common current source T_COM is activated or inactivated by the enable signal EN that activates or inactivates the majority decision circuit. If the enable signal EN is activated ('high'), the common current source T_COM flows current at the common node COM, such that the majority decision circuit performs the aforementioned majority decision operation (the majority decision circuit is activated). On the other hand, if the enable signal EN is inactivated ('low'), the common current source T_COM does not flow current at the common node COM. Therefore, since the voltage drop does not occur by the resistive elements R1 and R2, the voltage of the first node N1 and the second node N2 are at the 'high' level and the majority decision circuit does not perform the majority decision operation (the majority decision circuit is inactivated).

According to FIG. 2, the transistors T1_0 to T1_3, T2_0 to T2_3, T1_OFF, and T2_OFF and the common transistor T_COM are each an NMOS transistor and the resistive elements R1 and R2, the transistors T1_0 to T1_3, T2_0 to T2_3, T1_OFF, and T2_OFF, and the common transistor T_COM are sequentially connected from a power supply VDD stage to a ground power supply VSS stage, but the present invention is not limited to the disclosed embodiments.

At least one of the transistors T1_0 to T1_3, T2_0 to T2_3, T1_OFF, T2_OFF, and T_COM may be a PMOS transistor. In this case, the PMOS transistor is turned on in response to '0' (or 'low') and moves current. In this case, the voltage of the first node N1 and the second node N2 may be determined by the number of bits having the logical value '0' among the first data D1<0:1> and the number of bits having the logical value '0' among the second data D2<0:1> (that is, the first logical value may be '0').

A connection order of the resistive elements R1 and R2, the transistors T1_0 to T1_3, T2_0 to T2_3, T1_OFF, and T2_OFF, and the common transistor T_COM may be changed depending on different design needs. For example, the position of the first resistive element R1 and the transistors T1_0 to T1_3 and T1_OFF may be changed and the position of the second resistive element R2 and the transistors T2_0 to T2_3 and T2_OFF may be changed (the position of the first node N1 and the second node N1 may be between the first resistive element R1 and the transistors T1_0 to T1_3 and T1_OFF and between the second resistive element R2 and the transistors T2_0 to T2_3 and T2_OFF, respectively). The voltage of the first and second nodes N1 and N2 depends on the number of bits having the logical value '1' among the first data D1<0:3> and the number of bits having the logical value '1' among the second data D2<0:3>.

Further, the position of the resistive elements R1 and R2 and the common transistor T_COM may be changed. In this case, the position of the common node COM and the first and second nodes N1 and N2 is also changed and the voltage of the first and second nodes N1 and N2 depends on the number of bits having the logical value '1' among the first data D1<0:3> and the number of bits having the logical value '1' among the second data D2<0:3>.

Figure 3:
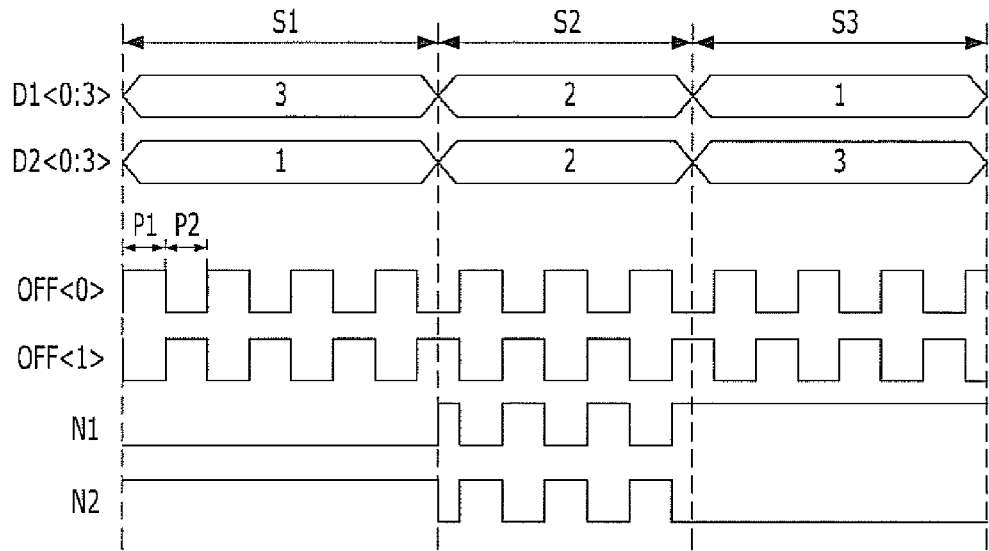
FIG. 3 is a waveform diagram for describing an operation of the majority decision circuit of FIG. 2.

FIG. 3 is a waveform diagram for describing an operation of the majority decision circuit of FIG. 2.

FIG. 3 illustrates that a clock signal of each bit OFF<0> and OFF<1> of the offset OFF<0:1> having an opposite phase to each other is applied to the majority decision circuit of FIG. 2. That is, the signal OFF<0> applied to a gate of the first offset transistor T1_OFF and the signal OFF<1> applied to a gate of the second offset transistor T2_OFF is the clock signal having the same period (or frequency) and the opposite phase. In the description of FIG. 2, the aforementioned first phase corresponds to a period P1 in which the 'OFF<0>' becomes 'high' and the 'OFF<1>' becomes 'low' and the second phase corresponds to a period P2 in which the 'OFF<0>' becomes 'low' and the OFF<1>' becomes 'high'.

Figures described in a waveform diagram of the first data D1<0:3> and the second data D2<0:3> represent the number of bits having the logical value '1' among the first data D1<0:3> and the number of bits having the logical value '1' among the second data D2<0:3>. That is, in FIG. 3, the number of bits having the logical value '1' among the first data D1<0:3> is three in a first section S1, two in a second section S2, and one in a third section S3. In addition, the number of bits having the logical value '1' among the second data D2<0:3> is one in the first section S1, two in the second section S2, and three in the third section S3.

In the first section S1 and the second section S2, the number of bits having the logical value '1' among the first data D1<0:3> is different from the number of bits having the logical value '1' among the second data D2<0:3> and thus, the value of the offset OFF<0:1> does not affect the logical value represented by the voltage of the first and second nodes N1 and N2. Since in the first section S1, the number of bits having the logical value '1' among the first data D1<0:3> is more than the number of bits having the logical value '1' among the second data D2<0:3>, the first node N1 is at the 'low' level and the second node N2 is at the 'high' level. Since in the third section S3, the number of bits having the logical value '1' among the second data D2<0:3> is more than the number of bits having the logical value '1' among the first data D1<0:3>, the first node N1 is at the 'high' level and the second node N2 is at the 'low' level.

Since in the second section S2, the number of bits having the logical value '1' among the first data D1<0:3> is equal to the number of bits having the logical value '1' among the second data D2<0:3>, the voltage of the first and second nodes N1 and N2 is determined by the value of the offset OFF<0:1>. Therefore, as illustrated in FIG. 3, the voltage of the first and second nodes N1 and N2 in the first phase and the voltage of the first and second nodes N1 and N2 in the second phase are changed.

Figure 4:
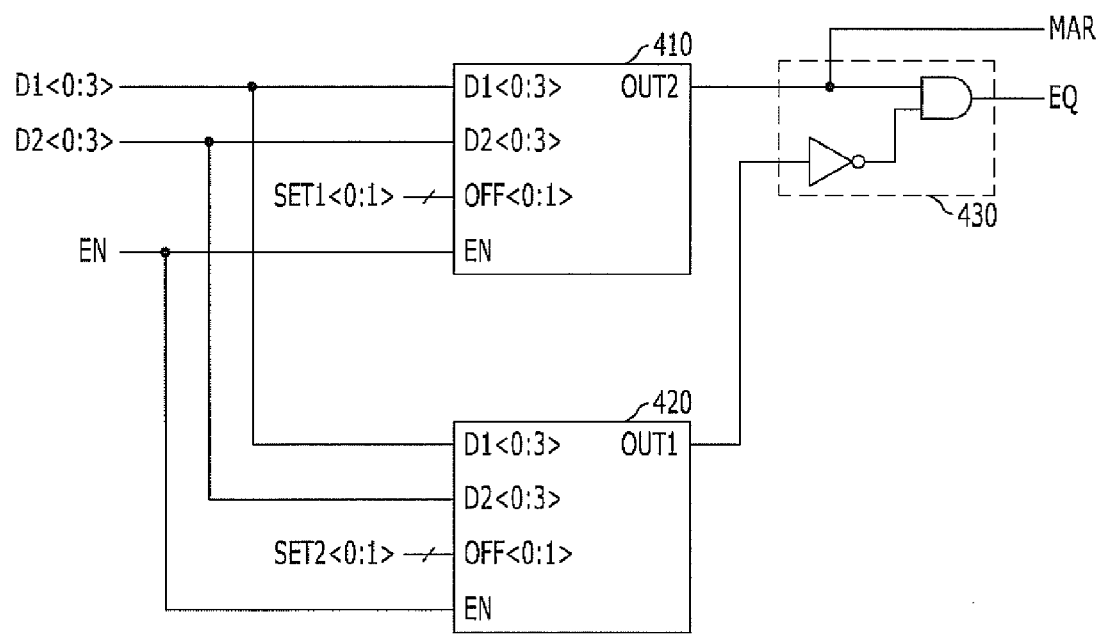
FIG. 4 is a configuration diagram of a majority decision circuit in accordance with another embodiment of the present invention.

FIG. 4 is a configuration diagram of a majority decision circuit in accordance with another embodiment of the present invention.

As illustrated in FIG. 4, a majority decision circuit includes a first majority decision unit 410 that compares the first data D1<0:3> with the second data D2<0:3> to output the decision results of the data of more bits having the first logical value and output the first logical value when the number of bits having the first logical value among the first data D1<0:3> is equal to the number of bits having the first logical value among the second data D2<0:3>, a second majority decision unit 420 that compares the first data D1<0:3> with the second data D2<0:3> to output the decision results of the data of more bits having the first logical value and output the second logical value inverting the first logical value when the number of bits having the first logical value among the first data D1<0:3> is equal to the number of bits having the first logical value among the second data D2<0:3>, and an equal signal generator 430 that activates an equal signal EQ representing that the number of bits having the first logical value among the first data D1<0:3> is equal to the number of bits having the first logical value among the second data D2<0:3> when a logical value of an output OUT1 of the first majority decision unit is different from a logical value of an output OUT2 of the second majority decision unit. Here, the first logical value may be '1' (or 'high') or '0' (or 'low'). Hereinafter, the case in which the first logical value is '1' will be described.

That is, the first majority decision unit 410 compares the first data D1<0:3> with the second data D2<0:3> to decide whether any data of the first data D1<0:3> and the second data D2<0:3> has more bits having the first logical value. When the number of bits having the first logical value of the first data D1<0:3> and the second data D2<0:3> is equal to the number of bits having the first logical value of the second data D2<0: 3>, it is decided that the first data D1<0:3> has more bits having the first logical value than the second data D2<0:3>. The second majority decision unit 420 compares the first data D1<0:3> with the second data D2<0:3> to decide whether any data of the first data D1<0:3> and the second data D2<0: 3> has more bits having the first logical value. When the number of bits having the first logical value of the first data D1<0:3> and the second data D2<0:3> is equal to the number of bits having the first logical value of the second data D2<0: 3>, it is decided that the second data D2<0:3> has more bits having the first logical value than the first data D1<0:3>. The equal signal generator 430 activate the equal signal (EQ) representing that the number of bits having the first logical value in the first data D1<0:3> is equal to the number of bits having the first logical value in the second data D2<0:3> when the decision results of the first majority decision unit 410 is different from the decision results of the second majority decision unit 420.

The majority decision circuit will be described with reference to FIGS. 2 and 4. The cases in which the number of bits having the logical value '1' among the first data D1<0:3> input to the majority decision circuit is different from or equal to the number of bits having the logical value '1' among the second data D2<0:3> will be described separately.

The configurations of the first majority decision unit 410 and the second majority decision unit 420 are each the same as the majority decision circuit of FIG. 2. That is, the majority decision circuit of FIG. 4 includes two majority decision circuits of FIG. 2.

The first majority decision unit 410 includes the first resistive element R1 that is connected to the first node N1 to cause the voltage drop, the second resistive element R2 that is connected to the second node N2 to cause the voltage drop, the first current source 211 that flows the positive current determined by the first data D1<0:3> at the first node N1, the second current source 212 that flows the positive current determined by the second data D2<0:3> at the second node N2, the first additional current source T1_OFF that flows the additional current at the first node N1 if the offset OFF<0:1> is a first setting value SET1<0> (OFF<0>, and OFF<1> are (1, 0)), and the second additional current source T2_OFF that flows the additional current at the second node N2 if the offset OFF<0:1> is the second setting value SET2<0:1> (OFF<0> and OFF<1> are (0, 1)), wherein the logical value of the voltage of the second node N2 is set to be OUT1 and the offset OFF<0:1> is set to be the first setting value SET1<0:1>. In addition, the first majority decision unit 410 includes the first common node COM that is connected to all of the first current source 211, the second current source 212, the first additional current source T1_OFF, and the second additional current source T2_OFF and the first common current source T_COM that is connected to the first common node COM to flow current at the first common node COM (the configuration of the first majority decision unit 410 is the same as the configuration of the majority decision circuit of FIG. 2 and therefore, reference numerals of each component is denoted by reference numerals used in FIG. 2).

The second majority decision unit 420 includes a third resistive element R1 that is connected to a third node N1 to cause voltage drop, a fourth resistive element R2 that is connected to a fourth node N2 to cause voltage drop, a third current source 211 that flows a positive current determined by the first data D1<0:3> at the third node N1, a fourth current source 212 that flows a positive current determined by the second data D2<0:3> at the fourth node N2, a third additional current source T1_OFF that flows additional current at the third node N1 if the offset OFF<0:1> is a second setting value SET2<0:1> (OFF<0> and OFF<1> are (0, 1)), and a fourth additional current source T2_OFF that flows additional current at the fourth node N2 if the offset OFF<0:1> is a second setting value SET2<0:1> (OFF<0> and OFF<1> are (0, 1)), wherein the logical value of the voltage of the fourth node N2 is set to be OUT2 and the offset OFF<0:1> is set to be the second setting value SET2<0:1>. In addition, the second majority decision unit 420 includes a second common node COM that is connected to all of the third current source 211, the fourth current source 212, the third additional current source T1_OFF, and the fourth additional current source T2_OFF and a second common current source T_COM that is connected to the second common node COM to flow current at the second common node T_COM (the configuration of the second majority decision unit 420 is the same as the configuration of the majority decision circuit of FIG. 2 and therefore, reference numerals of each component is denoted by reference numerals used in FIG. 2).

The configurations of the first and second majority decision units 410 and 420 may be changed depending on design needs in the majority decision circuit of FIG. 2.

Here, the output OUT1 of the first majority decision unit 410 of FIG. 4 becomes an output MAR of the majority decision circuit (which may be changed depending on design needs). When the number of bits having the logical value '1' among the first data D1 <0:3> is different from the number of bits having the logical value '1' among the second data D2 <0:3>, the output OUT1 of the first majority decision unit and the output OUT2 of the second majority decision unit has the same value. However, when the number of bits having the logical value '1' among the first data D1 <0:3> is equal to the number of bits having the logical value '1' among the second data D2 <0:3>, the output OUT1 of the first majority decision unit is at the 'high' level and the output OUT2 of the second majority decision unit 420 is at the 'low' level, such that they have different values. The offset OFF<0:1> applied to the first majority decision unit 410 is set to be the first setting value SET1<0:1> and the offset OFF<0:1> applied to the second majority decision unit 420 is set to be the second setting value SET2<0:2>, such that they are different from each other.

Therefore, the equal signal generator 430 activates the equal signal EQ representing that the number of bits having the logical value 1 among the first data D1<:3> is equal to the number of bits having the logical value '1' among the second data D2<0:3> when the output OUT1 of the first majority decision unit is different from the output OUT2 of the second majority decision unit. In FIG. 4, when the number of bits having the logical value '1' among the first data D1<0:3> is equal to the number of bits having the logical value '1' among the second data D2<0:3>, the output OUT1 of the first majority decision unit is at the 'high' level and the output OUT2 of the second majority decision unit is at the 'low' level, such that the equal signal generator 430 activates ('high') the equal signal EQ when the output OUT1 of the first majority decision unit is at the 'high' level and the output OUT2 of the second majority decision unit is at the 'low' level.

Here, the setting value SET1<0:1> and the second setting value SET2<0:1> may be switched to each other. In this case, the equal signal generator 430 may activate ('high') when the output OUT1 of the first majority decision unit is at the 'low' level and the output OUT2 of the second majority decision unit is at the 'high' level.

The majority decision circuit in accordance with the embodiment of the present invention, which is the analog majority decision circuit, may easily decide whether the number of bits having the logical value '1' among the data to be compared is the same according to whether the equal signal EQ is activated.

Figure 5:
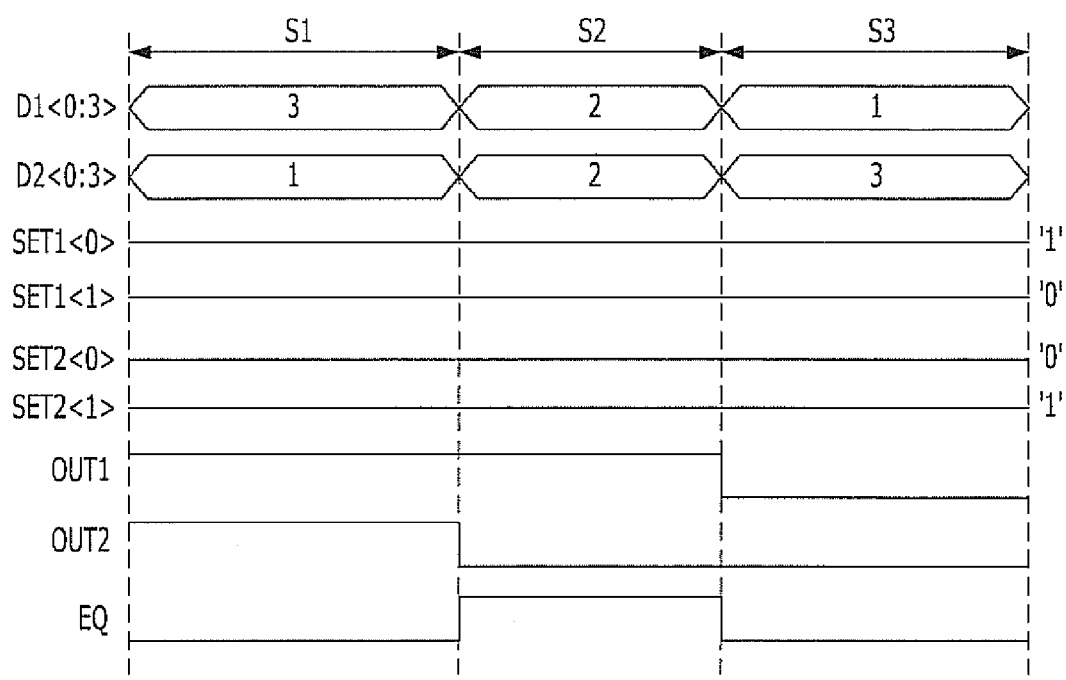
FIG. 5 is a waveform diagram for describing an operation of the majority decision circuit of FIG. 4.

FIG. 5 is a waveform diagram for describing an operation of the majority decision circuit of FIG. 4.

In FIG. 5, the case in which the first setting value SET1<0:1> ((OFF<0> and OFF<1>) are (1,0)) is applied to the offset OFF<0:1> of the first majority decision unit 410 and the second setting value SET2<0:1> is applied to the offset OFF<0:1> (OFF<0> and OFF<1> are (0, 1)) of the second majority decision unit 420 will be described.

Figures described in a waveform diagram of the first data D1<0:3> and the second data D2<0:3> represent the number of bits having the logical value '1' among the first data D1<0:3> and the number of bits having the logical value '1' among the second data D2<0:3>. That is, in FIG. 3, the number of bits having the logical value '1' among the first data D1<0:3> is three in the first section S1, two in the second section S2, and one in the third section S3. In addition, the number of bits having the logical value '1' among the second data D2<0:3> is one in the first section S1, two in the second section S2, and three in the third section S3.

In the first section S1 and the second section S2, the number of bits having the logical value '1' among the first data D1<0:3> is different from the number of bits having the logical value '1' among the second data D2<0:3> and thus, the value of the offset OFF<0:1> does not affect the outputs OUT1 and OUT2 of the first and second majority decision units. Since, in the first section S1, the number of bits having the logical value '1' among the first data D1 <0:3> is more than the number of bits having the logical value '1' among the second data D2 <0:3>, the outputs OUT1 and OUT2 of the first and second majority decision units are at the 'high' level. Since in the third section S3, the number of bits having the logical value '1' among the second data D2 <0:3> is more than the number of bits having the logical value '1' among the first data D1 <0:3>, the outputs OUT1 and OUT2 of the first and second majority decision units are at the 'low' level.

Since in the second section S2, the number of bits having the logical value '1' among the first data D1<0:3> is equal to the number of bits having the logical value '1' among the second data D2<0:3>, the outputs OUT1 and OUT2 of the first and second majority decision units are determined by the value of the offset OFF<0:1>. Here, since the offset OFF<0:1> of the first majority decision unit 410 is set to be the first setting value SET1<0:1>, the output OUT1 of the first majority decision unit is at the 'high' level and since the offset OFF<0:1> of the second majority decision unit 420 is to be the second setting value SET2<0:1>, the output OUT2 of the second majority decision unit is at the 'low' level.

The equal signal EQ is inactivated ('low') in the first section S1 and the third section S3 in which the number of bits having the logical value '1' among the first data D1<0:3> is different from the number of bits having the logical value '1' among the second data D2<0:3> and is activated ('high') in the second section S2 in which the number of bits having the logical value '1' among the first data D1<0:3> is equal to the number of bits having the logical value '1' among the second data D2<0:3>.

As set forth above, the majority decision circuit in accordance with the exemplary embodiment of the present invention can toggle the output signal when the number of bits representing the specific logical value among each bit of one input data is equal to the number of bits representing the specific logical value among each bit of the other input data or output the signal representing when the number of bits representing the specific logical value among each bit of one data is equal to the number of bits representing the specific logical value among each bit of the other data.

While the present invention has been described with respect to the specific embodiments, it will be apparent to those skilled in the art that various changes and modifications may be made without departing from the spirit and scope of the invention as defined in the following claims.

What is claimed is:

1. A majority decision circuit, comprising:
a first resistive element connected to a first node;
a second resistive element connected to a second node;
a first current source including first transistors configured to supply a current determined by a first data to the first node;
a second current source including second transistors configured to supply a current determined by a second data to the second node;
a first additional current source including a first offset transistor configured to supply additional current to the first node when an offset is set to be a first setting value in a first phase; and
a second additional current source including a second offset transistor configured to supply additional current to the second node when the offset is set to be a second setting value in a second phase,
wherein current amount flowing from any of the first offset transistor and the second offset transistor is smaller than the current flowing from each of the first transistors and the second transistors.

2. The majority decision circuit of claim 1, wherein when a number of bits with a first logical value among the first data is equal to a number of bits with the first logical value among the second data, a logical value represented by a voltage of the first node in the first phase and a logical value represented by a voltage of the first node in the second phase are changed or a logical value represented by the voltage of the second node in the first phase and the voltage represented by the second node in the second phase are changed.

3. The majority decision circuit of claim 1, further comprising:
a common node connected to the first current source, the second current source, the first additional current source, and the second additional current source; and
a common current source connected to the common node and configured to provide current to the common node.

4. The majority decision circuit of claim 1, wherein the first current source includes a plurality of first transistors that are each turned on/off in response to a respective bit of the first data and the second current source includes a plurality of second transistors that are each turned on/off in response to a respective bit of the second data.

5. The majority decision circuit of claim 4, wherein an amount of current flowing through one of the first and second additional current sources is smaller than the amount of current flowing when any one transistor of the first and second transistors is turned on.

* * * * *